(12) United States Patent
McBrearty et al.

(10) Patent No.: US 11,143,680 B2
(45) Date of Patent: Oct. 12, 2021

(54) ESTIMATION OF ENERGY LOSSES DUE TO PARTIAL EQUIPMENT FAILURE FOR PHOTOVOLTAIC SYSTEMS FROM MEASURED AND MODELED INPUTS

(71) Applicant: Locus Energy, Inc., Hoboken, NJ (US)

(72) Inventors: Charles McBrearty, San Francisco, CA (US); Shawn Kerrigan, Redwood City, CA (US); Michael Herzig, Leonia, NJ (US)

(73) Assignee: LOCUS ENERGY, INC., Hoboken, NJ (US)

( * ) Notice: Subject to any disclaimer, the term of this patent is extended or adjusted under 35 U.S.C. 154(b) by 801 days.

(21) Appl. No.: 15/910,194

(22) Filed: Mar. 2, 2018

(65) Prior Publication Data

US 2018/0196092 A1 Jul. 12, 2018

Related U.S. Application Data

(63) Continuation-in-part of application No. 13/729,066, filed on Dec. 28, 2012, now abandoned.
(Continued)

(51) Int. Cl.
*G01R 19/25* (2006.01)
*H02S 50/10* (2014.01)
(Continued)

(52) U.S. Cl.
CPC ......... *G01R 19/2513* (2013.01); *G06Q 10/04* (2013.01); *H02J 3/383* (2013.01); *H02S 50/10* (2014.12); *H02S 99/00* (2013.01); *G06F 17/18* (2013.01); *G06Q 50/06* (2013.01); *H02S 40/32* (2014.12); *H02S 50/00* (2013.01); *Y02E 10/56* (2013.01)

(58) Field of Classification Search
CPC ..... G01R 19/2513; H02S 50/10; H02S 99/00; H02S 40/32; H02S 50/00; H02J 3/383; G06Q 10/04; G06Q 50/06; Y02E 10/563; G06F 17/18
See application file for complete search history.

(56) References Cited

U.S. PATENT DOCUMENTS 3,872,286 A 3/1975 Putman
4,280,061 A 7/1981 Lawson-Tancred
(Continued)

FOREIGN PATENT DOCUMENTS

WO WO 02/25987 3/2002
WO WO 2006/119031 11/2006

OTHER PUBLICATIONS

"NOAA Solar Calculator: Find Sunrise, Sunset, Solar Noon and Solar Position for Any Place on Earth," NOAA Global Monitoring Laboratory, Date Unknown, retrieved from https://www.esrl.noaa.gov/gmd/grad/solcalc/, 3 pages.
(Continued)

*Primary Examiner* — Alexander Satanovsky
*Assistant Examiner* — Mark I Crohn
(74) *Attorney, Agent, or Firm* — Sheridan Ross P.C.

(57) ABSTRACT

The present invention provides methods and systems to estimate energy losses due to partial equipment failure in photovoltaic (PV) systems based on measured power and energy data, weather data, PV system configuration information, and modeled power and energy generation data.

18 Claims, 10 Drawing Sheets

Related U.S. Application Data

(60) Provisional application No. 62/473,519, filed on Mar. 20, 2017.

(51) Int. Cl.

| | |
|---|---|
| *H02J 3/38* | (2006.01) |
| *G06Q 10/04* | (2012.01) |
| *H02S 99/00* | (2014.01) |
| *G06Q 50/06* | (2012.01) |
| *H02S 40/32* | (2014.01) |
| *H02S 50/00* | (2014.01) |
| *G06F 17/18* | (2006.01) |
| *H02J 3/46* | (2006.01) |

(56) References Cited

U.S. PATENT DOCUMENTS

| | | | |
|---|---|---|---|
| 4,752,697 | A | 6/1988 | Lyons et al. |
| 5,712,572 | A | 1/1998 | Tamechika et al. |
| 6,311,137 | B1 | 10/2001 | Kurokami et al. |
| 6,425,248 | B1 | 7/2002 | Tonomura et al. |
| 7,020,566 | B2 | 3/2006 | Villicana et al. |
| 7,133,787 | B2 | 11/2006 | Mizumaki |
| 7,336,201 | B2 | 2/2008 | Green et al. |
| 7,742,897 | B2 | 6/2010 | Herzig |
| 8,106,543 | B2 | 1/2012 | Huang et al. |
| 8,115,096 | B2 | 2/2012 | Shan et al. |
| 8,269,374 | B2 | 9/2012 | De Caires |
| 8,373,312 | B2 | 2/2013 | O'Brien et al. |
| 8,682,585 | B1 | 3/2014 | Hoff |
| 8,725,437 | B2 | 5/2014 | Caine |
| 8,738,328 | B2 | 5/2014 | Herzig et al. |
| 9,638,831 | B1 * | 5/2017 | Hoff ........................ G06Q 50/06 |
| 9,660,574 | B2 | 5/2017 | Caine |
| 2002/0059035 | A1 | 5/2002 | Yagi et al. |
| 2002/0143693 | A1 | 10/2002 | Soestbergen et al. |
| 2004/0067746 | A1 | 4/2004 | Johnson |
| 2004/0103056 | A1 | 5/2004 | Ikeda et al. |
| 2004/0138977 | A1 | 7/2004 | Tomkins et al. |
| 2004/0148336 | A1 | 7/2004 | Hubbard et al. |
| 2004/0176965 | A1 | 9/2004 | Winch et al. |
| 2004/0177027 | A1 | 9/2004 | Adachi |
| 2004/0230377 | A1 | 11/2004 | Ghosh et al. |
| 2004/0236587 | A1 | 11/2004 | Nalawade |
| 2005/0004839 | A1 | 1/2005 | Bakker et al. |
| 2005/0039787 | A1 | 2/2005 | Bing |
| 2005/0131810 | A1 | 6/2005 | Garrett |
| 2006/0271214 | A1 | 11/2006 | Brown |
| 2007/0162367 | A1 | 7/2007 | Smith et al. |
| 2007/0174219 | A1 | 7/2007 | Bryan et al. |
| 2007/0203860 | A1 | 8/2007 | Golden et al. |
| 2007/0219932 | A1 | 9/2007 | Carroll et al. |
| 2007/0226163 | A1 | 9/2007 | Robles |
| 2008/0091590 | A1 | 4/2008 | Kremen |
| 2008/0091625 | A1 | 4/2008 | Kremen |
| 2008/0172256 | A1 | 7/2008 | Yekutiely |
| 2008/0215500 | A1 | 9/2008 | De La Motte |
| 2009/0177458 | A1 | 7/2009 | Hochart et al. |
| 2009/0222224 | A1 | 9/2009 | Lewis et al. |
| 2010/0174643 | A1 | 7/2010 | Schaefer et al. |
| 2010/0185337 | A1 | 7/2010 | Le Pivert |
| 2010/0219983 | A1 | 9/2010 | Peleg et al. |
| 2010/0271222 | A1 | 10/2010 | Kerrigan et al. |
| 2011/0066401 | A1 | 3/2011 | Yang et al. |
| 2011/0184583 | A1 | 7/2011 | El-Barbari et al. |
| 2011/0210610 | A1 | 9/2011 | Mitsuoka et al. |
| 2011/0282601 | A1 | 11/2011 | Hoff |
| 2013/0085885 | A1 | 4/2013 | Sahai et al. |
| 2013/0264884 | A1 | 10/2013 | Kuo et al. |
| 2014/0018969 | A1 | 1/2014 | Forbes |
| 2014/0188410 | A1 | 7/2014 | Kerrigan et al. |
| 2015/0012258 | A1 | 1/2015 | Caine |
| 2015/0123798 | A1 | 5/2015 | Boross et al. |
| 2015/0188415 | A1 | 7/2015 | Abido et al. |
| 2016/0190984 | A1 | 6/2016 | Caine |
| 2017/0286838 | A1 | 10/2017 | Cipriani et al. |
| 2018/0073980 | A1 | 3/2018 | Caine |
| 2018/0188301 | A1 | 7/2018 | McBrearty et al. |
| 2018/0196901 | A1 | 7/2018 | McBrearty et al. |

OTHER PUBLICATIONS

Reno et al., "Global Horizontal Irradiance Clear Sky Models: Implementation and Analysis," Sandia National Laboratories, Report No. SAND2012-2389, dated Mar. 2012, retrieved from https://prod-ng.sandia.gov/techlib-noauth/access-control.cgi/2012/122389.pdf, 68 pages.

Notice of Allowance for U.S. Appl. No. 15/702,604, dated Aug. 27, 2019, 8 pages.

Official Action for U.S. Appl. No. 15/910,147, dated Apr, 1, 2020, 28 pages.

Official Action for U.S. Appl. No. 15/910,166 dated Apr. 3, 2020, 25 pages.

Official Action for U.S. Appl. No. 13/726,066 dated May 16, 2019, 37 pages.

"Atlas DCA," Peak Electronic Design, Ltd., 2008.

"CM21 Precision Pyranometer Instruction Manual," Kipp & Zonen, 2004, version 1004, 66 pages.

"PVIQ Performance Analysis," Locus Energy, Oct. 2013, 11 pages [retrieved from: http://locusenergy.com/wp-content/uploads/2013/10/Locus-Energy-PVIQ-Performance-Analysis-White-Paper.pdf].

"Pyranometer Model SP-110 and SP-230 Owner's Manual," Apogee Instruments, Inc., 2013, 18 pages.

Burger et al., "Asset Securitisation," 2006, pp. 1-67.

Chaouachi et al. "A novel multi-model neuro-fuzzy-based MPPT for three-phase grid-connected photovoltaic system," Solar Energy, 2010, vol. 84, pp. 2219-2229.

Geuder et al. Long-term Behavior, Accuracy and Drift of LI-200 Pyranometers as Radiation Sensors in Rotating Shadowband Irradiometers (RSI), Energy Procedia, Dec. 2014, vol. 49, pp. 2330-2339.

Hammer et al., "Solar energy assessment using remote sensing technologies," Remote Sensing of Environment, vol. 86, 2003, pp. 423-432.

Kroposki et al., "Photovoltaic module energy rating methodology development," 25th PVSC, May 13-17, 1996, pp. 1311-1314.

Li et al., "Determining the Optimum Tilt Angle and Orientation for Solar Energy Collection Based on Measured Solar Radiance Data," International Journal of Photoenergy, vol. 2007, No. 85402, 2007, 9 pages.

Patcharaprakiti et al. "Modeling of Photovoltaic Grid Connected Inverters Based on Nonlinear System Identification for Power Quality Analysis," Electrical Generation and Distribution Systems and Power Quality Disturbances, InTech, Nov. 2011, vol. 21, pp. 53-82.

Perez et al., "A New Operational Satellite-to-Irradiance Model—Description and Validation," Manuscript Submitted to Solar Energy, Apr. 2002, retrieved from http://www.asrc.cestm.albany.edu/perez/publications/Solar%20Resource%20Assessment%20and%20Modeling/Papers%20on%20Resource%20Assessment%20and%20Satellites/A%20New%20Operational%20Satellite%20irradiance%20model-02.pdf.

Wang, "The Application of Grey System Theory in Asset Securitization Project," Journal of Grey System, vol. 19, No. 3, 2007, pp. 247-256, abstract only.

Zhu et al., "Outlier identification in outdoor measurement data: effects of different strategies on the performance descriptors of photovoltaic modules," Proceedings of the 34th IEEE Photovoltaic Specialists Conference, Jun. 7-12 2009, pp. 828-833.

Notice of Allowance for U.S. Appl. No. 13/253,154, dated Jan. 6, 2014, 10 pages.

Official Action for U.S. Appl. No. 14/326,342, dated Oct. 19, 2017 32 pages.

Official Action for U.S. Appl. No. 14/584,202, dated May 18, 2017 26 pages.

Official Action for U.S. Appl. No. 14/584,202, dated Jan. 4, 2018, 37 pages.

(56) References Cited

OTHER PUBLICATIONS

Official Action for U.S. Appl. No. 14/957,374, dated Oct. 12, 2016 9 pages.
Notice of Allowance for U.S. Appl. No. 14/957,374, dated Feb. 15, 2017 7 pages.
Official Action for U.S. Appl. No. 15/702,604, dated Apr. 4, 2019, 10 pages.
Official Action for U.S. Appl. No. 13/729,066, dated Nov. 4, 2015, 6 pages. Restriction Requirement.
Official Action for U.S. Appl. No. 13/729,066, dated Mar. 11, 2016, 16 pages.
Official Action for U.S. Appl. No. 13/729,066, dated Aug. 12, 2016, 22 pages.
Official Action for U.S. Appl. No. 13/729,066, dated Jul. 3, 2017, 25 pages.
Official Action for U.S. Appl. No. 13/729,066, dated Mar. 9, 2018, 24 pages.
Official Action for U.S. Appl. No. 13/726,066 dated Dec. 3, 2018, 35 pages.
Notice of Allowance for U.S. Appl. No. 15/910,147, dated Nov. 12 2020, 18 pages.
Notice of Allowance for U.S. Appl. No. 15/910,166 dated Nov. 12, 2020, 16 pages.

\* cited by examiner

Figure 2 - Potential Components

FIGURE 7

| timestamp | modeled power (W) | modeled energy (Wh) |
|---|---|---|
| 2015-1-1 12:00 | 600 | 10 |
| 2015-1-1 12:05 | 660 | 11 |
| 2015-1-1 12:10 | 540 | 9 |

FIGURE 8

| timestamp | modeled power (W) | modeled energy (Wh) | measured power (W) | measured energy (Wh) | performance ratio (unit-less) |
|---|---|---|---|---|---|
| 2015-1-1 12:00 | 600 | 10 | 598 | 9.9 | 10 / 9.9 ~= 1.01 |
| 2015-1-1 12:05 | 660 | 11 | 662 | 11.01 | 11 / 11.01 ~= 1.0 |
| 2015-1-1 12:10 | 540 | 9 | 545 | 9.1 | 9 / 9.1 ~= .99 |

FIGURE 9

| date | daily effective system size (max of performance ratios for that day) |
|---|---|
| 2015-1-1 | 1.01 |
| 2015-1-2 | .99 |
| 2015-1-3 | .8 |

FIGURE 10

| date | daily effective system size differential | |
|---|---|---|
| 2015-1-1 | -0.02 | |
| 2015-1-2 | -0.19 | <---- we would see a drop like this is if 1/5 of the system capacity suffered partial failure on 1/2/15 |
| 2015-1-3 | 0.01 | |

FIGURE 11

| timestamp | modeled energy (Wh) | inferred daily effective system size | loss to partial system downtime (Wh) |
|---|---|---|---|
| 2015-1-1 12:00 | 600 | 1 | 0 |
| 2015-1-1 12:05 | 660 | 1 | 0 |
| 2015-1-1 12:10 | 540 | 1 | 0 |
| ..... | ..... | ..... | |
| 2015-1-4 12:00 | 600 | .8 | 120 |
| 2015-1-4 12:05 | 630 | .8 | 126 |
| 2015-1-4 12:10 | 570 | .8 | 114 |

Typical probability distribution of normalized daily effective system size differentials. Anomalies highlighted in red.

ESTIMATION OF ENERGY LOSSES DUE TO PARTIAL EQUIPMENT FAILURE FOR PHOTOVOLTAIC SYSTEMS FROM MEASURED AND MODELED INPUTS

This application claims priority to provisional patent application 62/473,519 filed Mar. 20, 2017. This application is a continuation in part of application Ser. No. 13/729,066 filed Dec. 28, 2012. Applications 62/473,519 and Ser. No. 13/729,066 are incorporated herein by reference. The patent or application file contains at least one drawing executed in color. Copies of this patent or patent application publication with color drawing(s) will be provided by the Office upon request and payment of the necessary fee.

The installed base of solar photovoltaic (PV) systems in the United States is large and growing rapidly. Viewed as financial assets, these systems are in aggregate an investment worth tens of billions of dollars. Viewed as a fraction of the power generation on the grid, there is enough solar installed in some localities that the generation of these systems has a material impact on efforts to balance the electric grid. Understanding the performance of these systems relative to expectations is critically important to operations and maintenance efforts which rely on being able to quickly and accurately make decisions about whether or not a system is in need of maintenance based on information that can be collected remotely.

Understanding the performance of these systems is also valuable in contexts that include assessing the financial value of any contract that includes payouts based on the performance of solar assets (e.g., leases, PPA's, guarantees, etc.), assessing the value of the underlying solar assets themselves, or assessing the suitably of a location as a location to install solar assets.

Models that estimate the power generation of PV systems are primarily dependent on the size of the system in question, the solar irradiance incident on the system, and the temperature of the PV modules. There are a variety of models of different levels of complexity that are in common usage and their error characteristics have been discussed in a number of academic and industry conferences and publications. These models are typically calibrated in controlled settings however, and can generate modeling errors that are well above the expected modeling errors when PV systems are affected by factors that do not occur in controlled settings. Such factors include soiling, shading, snow cover, and partial hardware failure. The current state of the art for dealing with errors of this type is to use a derate factor which estimates the fraction of the total energy over the lifetime of the system will be lost for this reason and then reduces all power generation estimates by that fraction. Methodologies like this are destined to produce inaccurate results when there are short term fluctuations in the losses that occur for any of these reasons. One particularly simple example of this is that if derates are used to model losses due to snow cover, then the models will necessarily overestimate energy production in a very snowy winter and underestimate production during a winter with lower than normal snowfall. Augmenting the current state of the art PV performance models to include highly granular categorized loss estimates (including due to equipment failure) enables them to better describe the measured performance of real world systems. This is potentially valuable for a wide variety of applications.

With the proliferation of solar PV systems as a source of energy generation at residential, commercial, and industrial scales, understanding the performance of these systems in the field, and outside of controlled laboratory conditions, is an increasingly important task with a number of important applications. Partial equipment failure in PV systems is a major driver of PV systems underperforming their expectations, so it is therefore an essential piece of efforts to understand PV system underperformance in general. Due to the expense of maintaining monitoring equipment, it is often the case that many PV components that can fail independently are monitored only in aggregate instead of independently. This then creates a need for methods and logic to efficiently and accurately detect failures of individual components that are monitored only on in aggregate in the presence of significant factors that can affect overall system performance and confound analyses.

The present invention provides the methodology to estimate energy losses due to partial equipment failure in PV systems from data including the measured energy and power produced over the lifetime of the system, the system size and configuration data, the weather conditions (including irradiance, ambient and panel temperature, and wind conditions) over the lifetime of the system, and modeled power and energy generation data for the system.

These and other features, aspects and advantages of the present invention will become better understood with reference to the following description and claims.

SUMMARY OF THE INVENTION

The present invention relates to a computer processor implemented methods of estimating energy losses due to partial equipment failure in PV systems from measured and modeled inputs.

According to one embodiment of the present invention, a computer processor implemented method of quantifying the energy losses of a photovoltaic system due to partial equipment failure is provided, comprising the steps of: inputting into a computer processor modeled power and energy time series data for a photovoltaic system, wherein the modeled power energy time series data includes a set of series of a timestamp, a modeled power and a modeled energy; inputting into a computer processor measured power and energy time series data for the photovoltaic system, wherein the measured power and energy time series data includes a set of actual data readings having a power and energy reading with an associated measured time series data timestamp; inputting into a computer processor an age of the photovoltaic system; merging by the computer processor the modeled power and energy time series data with the measured power and energy time series data to determine and to provide a performance ratio time series; determining in a computer processor a normalized daily effective system capacity time series by calculating the daily maximum of the performance ratio times series with outliers removed to provide a normalized daily effective system capacity time series; determining in a computer processor a set of differentials between consecutive daily data points in the normalized daily effective system capacity time series; applying an anomaly filter to the set of differentials between consecutive daily data points in the normalized daily effective system capacity time series to identify days on which the capacity of the system is likely to have changed; partitioning the normalized daily effective system capacity time series and then calculating measures of central tendency for the resulting partitions to generate a piecewise constant time series that describes the normalized daily effective system size; modulating the modeled power energy time series data by the inverse of the piecewise constant time series to provide an estimate of power and energy losses due to partial equipment failure.

These and other features, aspects and advantages of the present invention will become better understood with reference to the following description and claims.

BRIEF DESCRIPTION OF THE DRAWINGS

FIG. 7 depicts a modeled power and energy time series data for a photovoltaic system according to the present invention;
FIG. 8 depicts a performance ratio time series according to the present invention;
FIG. 9 depicts a step according to the present invention;
FIG. 10 depicts a step according to the present invention;
FIG. 11 depicts a step according to the present invention.

DETAILED DESCRIPTION OF THE INVENTION

Figure 1:
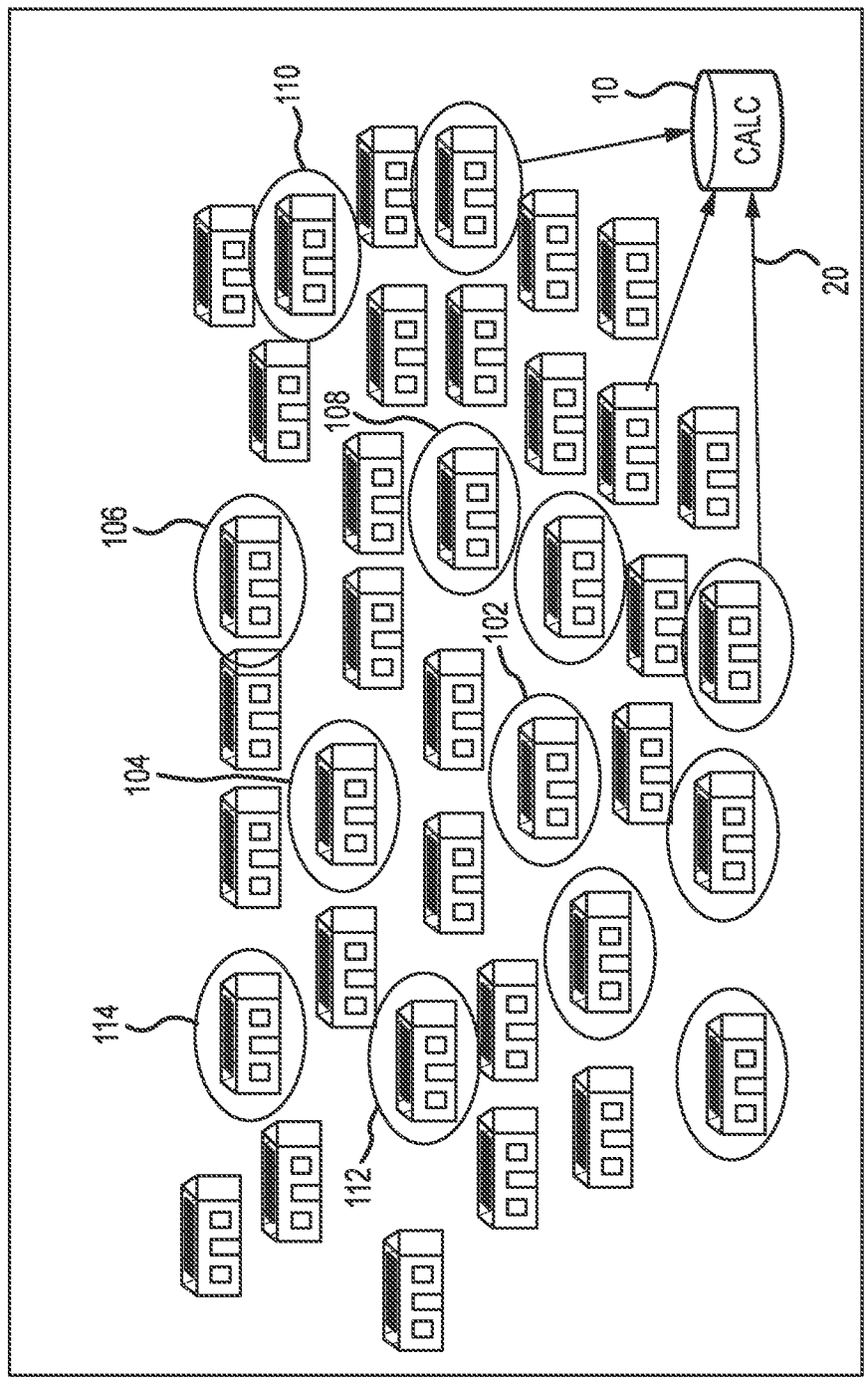
FIG. 1 depicts the present invention.
Figure 2:
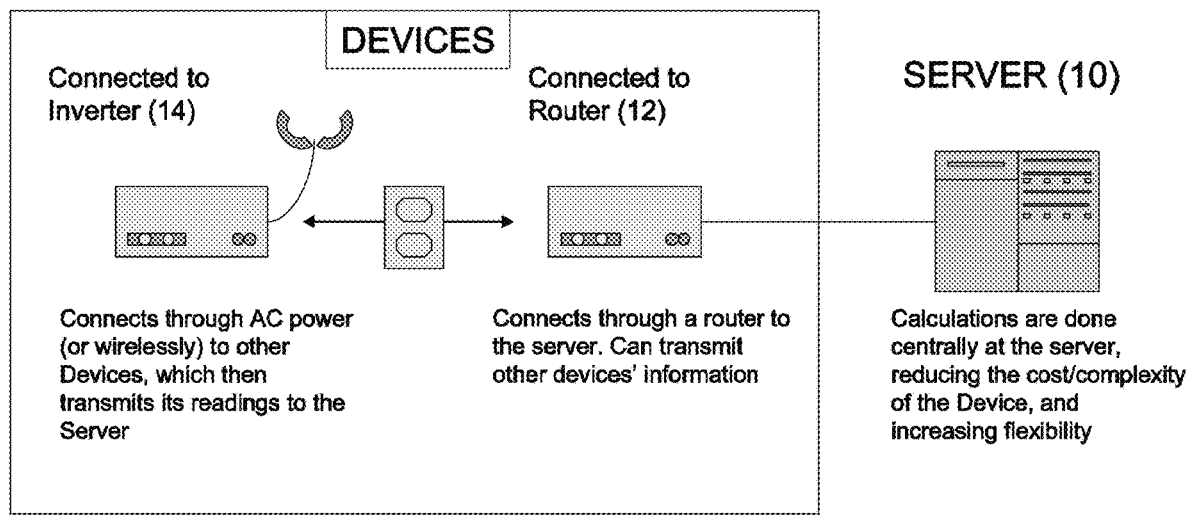
FIG. 2 depicts the present invention.
Figure 3:
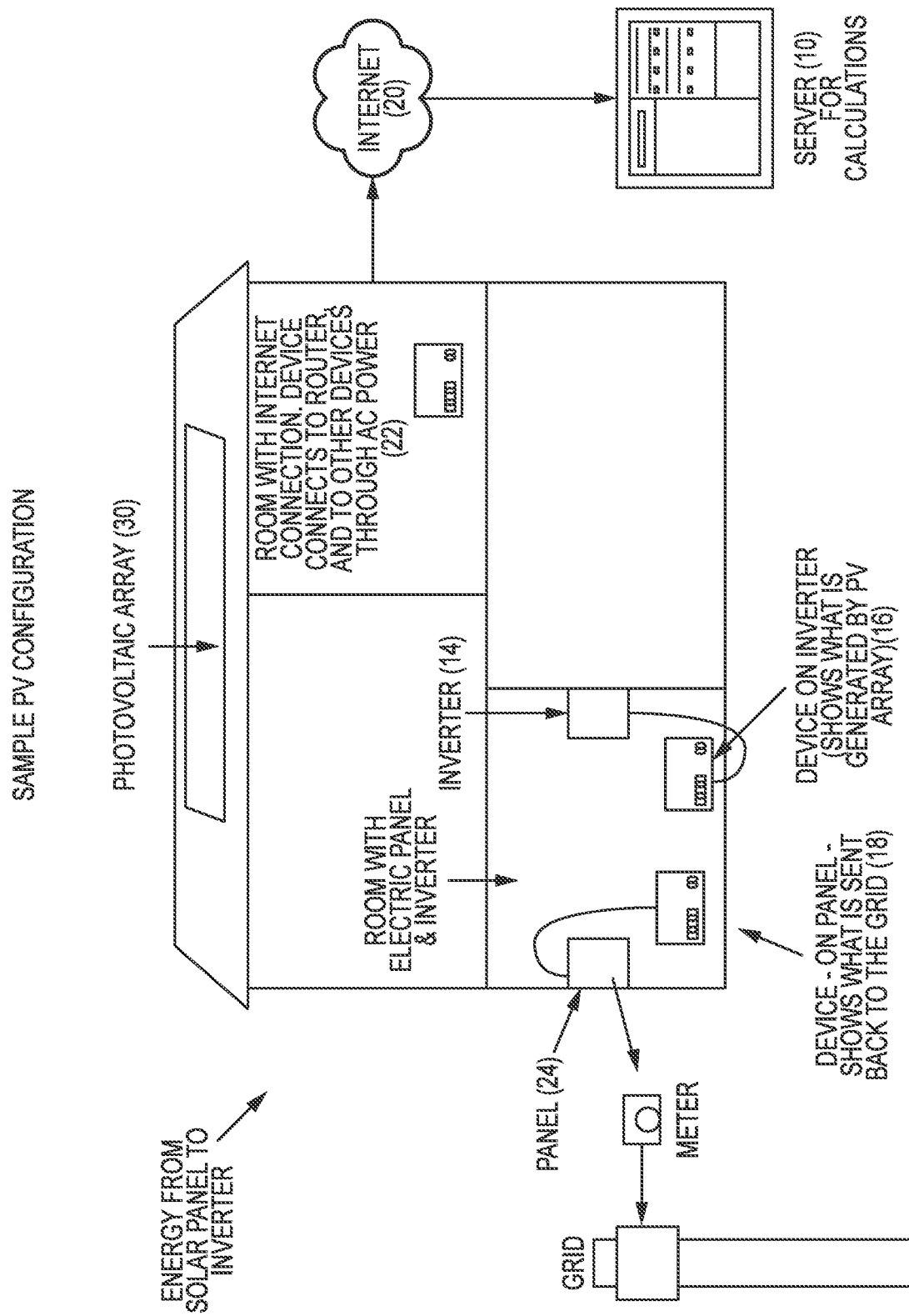
FIG. 3 depicts the present invention.
Figure 4:
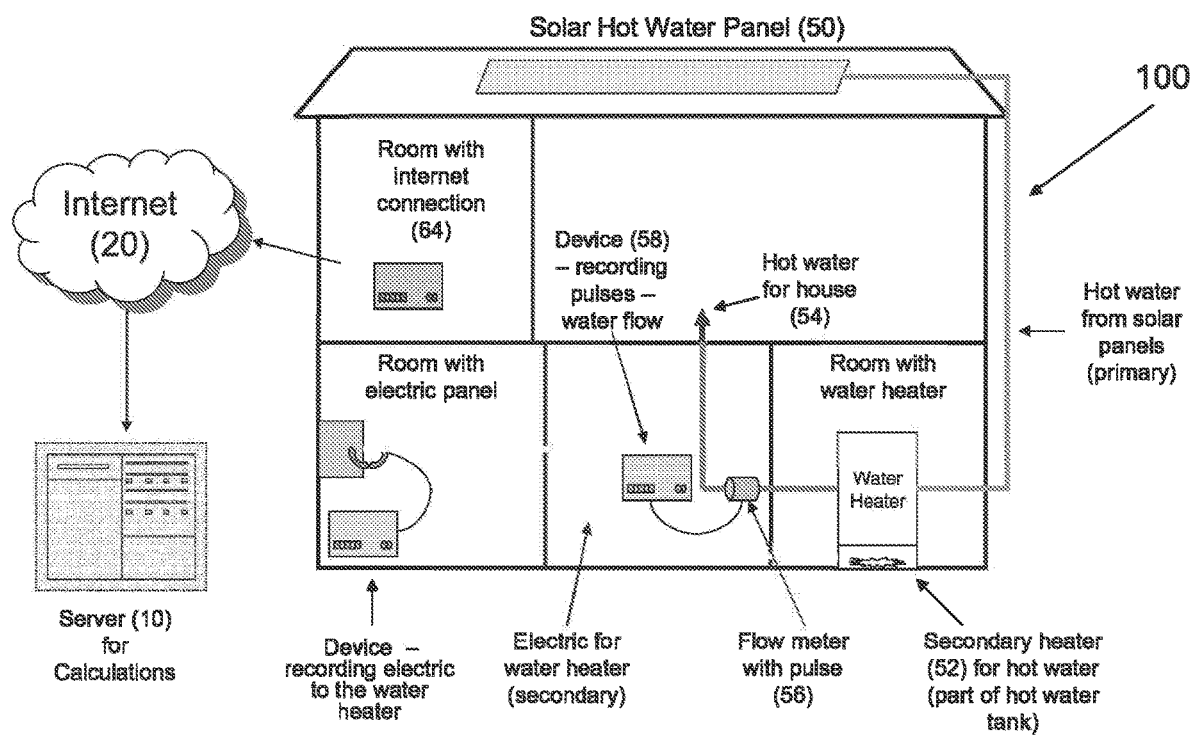
FIG. 4 depicts the present invention.
Figure 5:
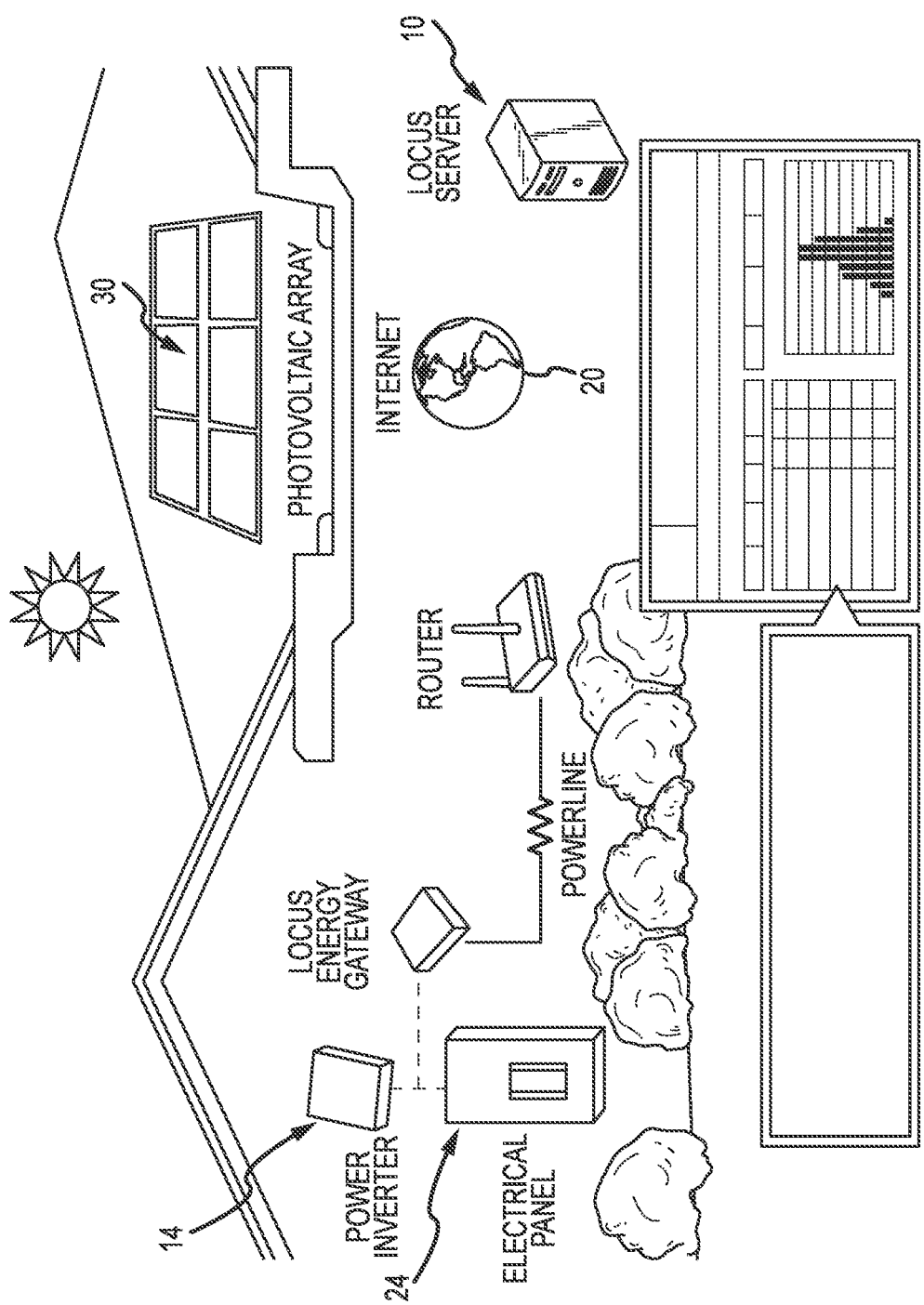
FIG. 5 depicts the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

FIGS. 1-5 provide examples of a monitored renewable energy system (more specifically a photovoltaic array solar panel also referred to herein as a solar photovoltaic system or solar powered system) from which information may be obtained. According to the example shown, there is a server 10 and at least one monitored renewable energy system (e.g. 102, 104, 106, 108, 110, 112) which is provided to a user or consumer. There may be at least one data server (10), at least one generation monitoring device (16) in communication with the monitored renewable energy system (at premise monitored renewable energy system (30)) and at least one communication node (22) in communication with at least one of the monitored renewable energy system (30), the generation monitoring device (16) and the data server (10). It should be understood the data server may be a single computer, a distributed network of computers, a dedicated server, any computer processor implemented device or a network of computer processor implemented devices, as would be appreciated by those of skill in the art. The monitored renewable energy system may have background constants that are entered into the system during data setup; populating this part of the data structure is one of the initial steps to the process. During this time, all required (or potentially required) background information may be loaded into the system. This data will later be used for system calculations and diagnostics. Background constants may include: (1) Full Calendar with sunrise and sunset according to latitude throughout the year; (2) Insolation or 'incident solar radiation': This is the actual amount of sunlight falling on a specific geographical location. There are expected amounts of radiation which will fall on an area each day, as well as an annual figure. Specific Insolation is calculated as kWh/m2/day. The importance of this variable is that it can combine several other Background Constants; and (3) Location Functionality. It is envisioned that some of this information may be input and some may be determined automatically. The proximity of each system to each other system may be determined, and forms a part of the methods used to determine the geographic average of the renewable energy systems. While there are different specific methods of implementing Location Functionality, generally this relies on a large database of locations which are tied to zones. Because the relational distances between the zones are stored within the software, the distances between any two locations can then be easily and accurately calculated.

The term production data refers to any data that is received from the photovoltaic system and/or solar irradiance sensor. The energy generated by each monitored renewable energy system and/or solar irradiance sensor is recorded as production data and the data server may then determine comparative information based upon at least one of the background constant, the diagnostic variable, the system coefficient and the energy generated to determine a comparative value of the monitored renewable energy system. The term comparative value is intended to include any value that compares one system to another system or a group of systems. For example, this may be as simple as an "underperforming" designation when the system's performance is less than another system or group of systems performance in terms of power generated.

A sample system may have a router (12) and at least one inverter (14) in communication with the monitored renewable energy system (e.g. 50, 30). The inverter (14) is an electronic circuit that converts direct current (DC) to alternating current (AC). There may also be at least one return monitor (18) (associated with electric panel (24)) determining the energy returned to a grid by the at-least one monitored renewable energy system. At least one background constant may be determined and saved in the data server(s). The monitored renewable energy system (e.g. 30, 50) may be at least partially powered by at least one alternate energy source. There may be at least one generation monitoring device (e.g. 58), which calculates the energy generated at each consumer's premises by the monitored renewable energy system (e.g. 30, 50); at least one communication node (64) in communication with each at least one generation monitoring device (e.g. 58); at least one data server (10) in communication with communication node (e.g. 64), wherein the data server(s) (10) accept information from the communication node (e.g. 64) to determine the power generated at a first user's premises (100) and compare the power generated at a first user's premises (100) to Comparative Information obtained from at least two monitored renewable energy systems (e.g. 102, 104, 106, 108, 110, 112, 114) to determine if the first user's monitored renewable energy system (100) is within a predetermined deviation from the comparative information. This may provide a comparative value. The communication node may be further comprising a data storage means for storing usage information. For example, the communication node (64) may be a computer with a hard drive that acts as a data storage means for storing usage information. The generation monitoring device may be selected from the group consisting of pulse meter, temperature meter, electromechanical meter, solid state meter, flow meter, electric meter, energy meter and watt meter. There may also be at least one return monitoring device in communication with the inverter which calculates the energy returned to a grid by the system.

The monitored renewable energy system may be, for example, a solar system, solar panel system, photovoltaic, thermal, wind powered, geothermal, hydropower. A secondary energy source (e.g. 52) may be in communication with and at least partially powering the monitored renewable energy system. It should be understood, though, this is only for ancillary power in the event that the renewable energy source (50) is not capable of entirely powering the at premise monitored renewable energy system.

The generation monitoring device may be any type of meter, by way of example, this may include a pulse meter, temperature meter, electromechanical meter, solid state meter, flow meter, electric meter, energy meter and watt meter. An installation will have a communication node or hub set up at the location with the system. One of the communication nodes may act as a hub. These devices connect to the internet (20) and send the data collected by the nodes to the server (10). They have the following properties: The hub has a web server and connects to a standard internet connection (Ethernet). It does not require a computer or other device to make this connection. Each hub has its own unique IP or DNS address. The hub is configured by a web browser. The web browser allows the hub to have specific nodes assigned to it. This set up feature will allow another hub in the area to be set up with its own nodes so that all can operate wirelessly without disruption. Also, the hub is able to configure specific aspects of the hub, such as the connection with the server, data recording and time settings and the ability to configure the attached nodes, including their recording properties.

Each installation may have two or more Data Nodes. These are typically connected wirelessly to the Hub, and connected directly to the inputs/outputs from the Solar Hot Water system (50). They communicate constantly with the Hub, transferring data which the Hub then sends up to the server (10). They may have the following properties: The first Required Node connects to a flow meter (56) attached to the Water Tank that is connected to the Solar Hot Water system. This Node will operate as a pulse meter, 'clicking' whenever a unit (either a gallon or a liter) of hot water passes from the tank. The second Required Node connects to either the electric panel at the switch for the Hot Water tank's electric power OR to a flow/other meter for gas/oil to the secondary heater for the Hot Water tank. The Node may have a data storage means for storing flow/usage information. Together, the data gathered from these Required Node connections allow the software on the serve to convert the utilized hot water into an accurate reading of utilized solar energy by subtracting the energy required to by the secondary heating mechanism. The term utilized generation refers to the energy generated by the at-premise power system, less any energy that has not been consumed by the at premise power system (e.g. the energy used to heat water that remains in the tank and is not subsequently used). Note that the term "at-premise power system" is one type of monitored renewable energy system, as claimed. There may also be other Nodes, which may be used to measure other aspects of the system and gain even more accurate readings. For example: the temperature of the hot water on an ongoing basis. The system may be monitored from a remote location (such as a computer in a different location).

The components node (100), hub (102) and server (10) make up the required core components needed to accurately measures the actual usable output from a Solar Hot Water (SHW) system. Essentially, the hub (102) connects to multiple nodes (100) which simultaneously measure the secondary power going into the system along with the hot water going out (54). Controlling for any background power requirements (e.g. for pumping), it can measure the usable BTUs created by solar by analyzing the measurements at the server (10) level.

Before installing a photovoltaic system in a given location, an estimate of performance expectations is created considering the locational context, typical climate and proposed equipment. Performance expectation estimates also employ assumptions regarding factors that could reduce performance, such as shading, equipment mismatch, and soiling. Properly choosing these assumptions is one of the more difficult aspects of system modeling. Measured performance of an installed system is often compared against the performance expectations to understand if a photovoltaic system is functioning properly.

Figure 6:
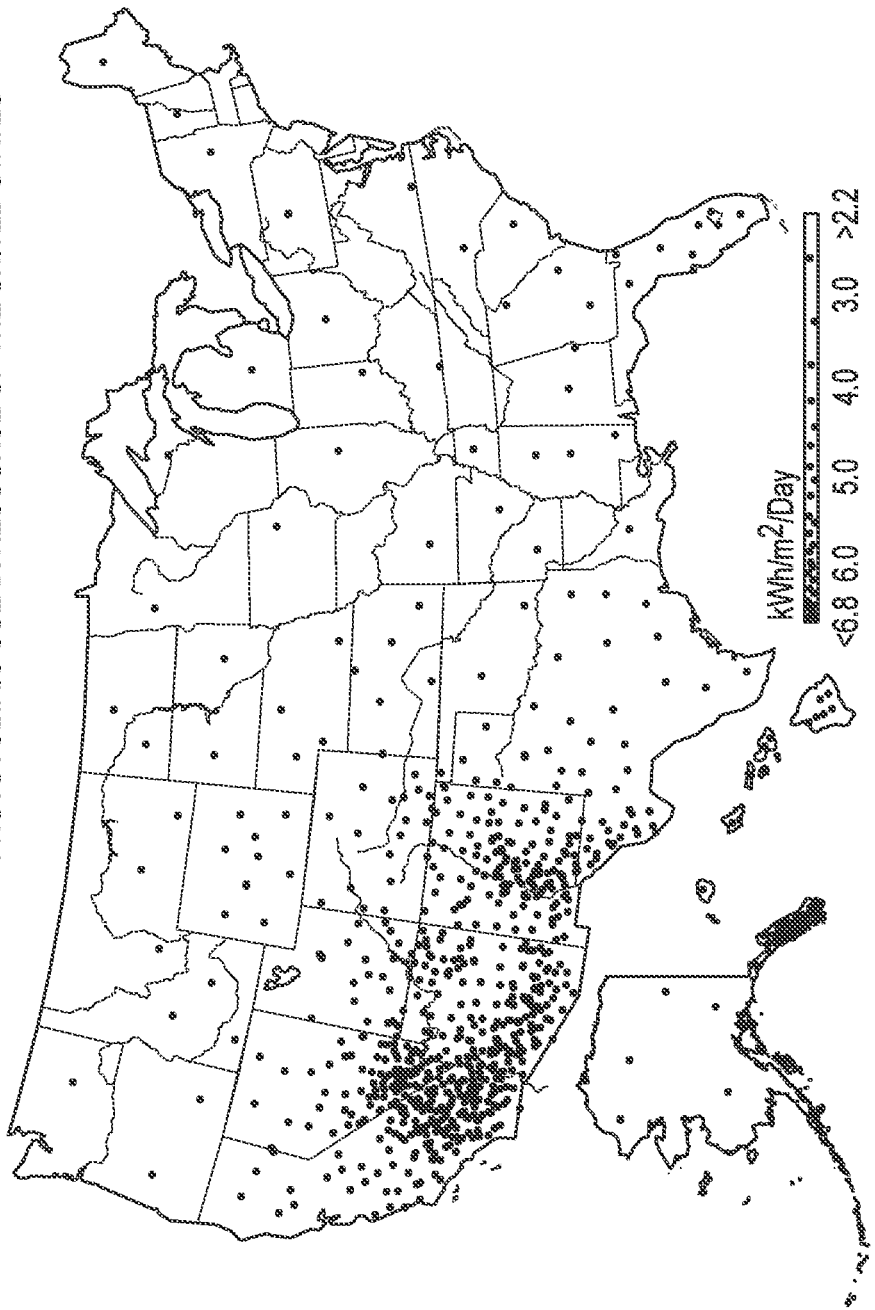
FIG. 6 depicts the present invention.

Shading and soiling losses reduce the incoming incident irradiance that strikes the PV panel. Cell temperature is either directly measured by a weather station on site, or calculated using incident irradiance, ambient temperature, and wind speed. FIG. 6 depicts a photovoltaic resource map. As can be seen, the southwestern portion of the United States has the greatest potential photovoltaic resources.

This disclosure describes the methodology to estimate energy losses due to partial equipment failure in PV systems from data including the measured energy and power produced over the lifetime of the system, the system size and configuration data, the weather conditions (including irradiance, ambient and panel temperature, and wind conditions) over the lifetime of the system, and modeled power and energy generation data for the system.

The Methodology is comprised of the following background variables, input parameters and logic based on those variables.

MEASURED POWER AND ENERGY DATA: This data may be measured with an on-site physical sensor installed with a PV system or within the inverter.

SYSTEM CONFIGURATION DATA: This data describes the size, orientation (tilt and azimuth angles for the panels), age, and location of the system.

IRRADIANCE DATA: On-site measured irradiance data and/or satellite modeled irradiance data WEATHER DATA: This includes temperature and/or wind conditions data from on-site and/or nearby weather stations.

MODULE TEMPERATURE DATA: measured data from sensors on individual PV modules

SNOW DATA: Estimates of the precipitation in the form of snow and snow depth at the location of the system.

MODELED POWER AND ENERGY DATA: Estimates of what the power and energy production of the PV system would have been in the absence of equipment failure. This should be calculated using industry standard best practices in PV system performance modeling.

The present invention provides a computer processor implemented method of quantifying the energy losses of a photovoltaic system due to partial equipment failure comprising the steps of: inputting into a computer processor modeled power and energy time series data for a photovoltaic system, wherein the modeled power energy time series data includes a set of series of a timestamp, a modeled power and a modeled energy; inputting into a computer processor measured power and energy time series data for the photovoltaic system, wherein the measured power and energy time series data includes a set of actual data readings having a power and energy reading with an associated measured time series data timestamp; inputting into a computer processor an age of the photovoltaic system; merging by the computer processor the modeled power and energy time series data with the measured power and energy time series data to determine a to provide a performance ratio time series; determining in a computer processor a normalized daily effective system capacity time series by removing outliers in the performance ratio time series to provide a performance ratio times series with outliers removed and calculating the daily maximum of the performance ratio times series with outliers removed to provide a normalized daily effective system capacity time series; determining in a computer processor a set of differentials between consecutive daily data points in the normalized daily effective system capacity time series; applying an anomaly filter to the set of differentials between consecutive daily data points in the normalized daily effective system capacity time series to identify days on which the capacity of the system is likely to have changed; partitioning the normalized daily effective system capacity time series and then calculating measures of central tendency for the resulting partitions to generate a piecewise constant time series that describes the normalized daily effective system size; modulating the modeled power energy time series data by the inverse of the piecewise constant time series to provide an estimate of power and energy losses due to partial equipment failure.

The step of inputting into a computer processor modeled power and energy time series data for a photovoltaic system, may be done using PVWatts. PVWatts is a web application for estimating the energy production of a grid-connected photovoltaic (PV) system. According to one embodiment of the present invention PV Watts version 5 is used to calculate the power produced by the panels on an instantaneous basis. An example part of the modeled power and energy time series data for a photovoltaic system according to the present invention in tabular format is depicted in FIG. 7. Note that this time series usually has a few years of data, so it would be hundreds of thousands of rows. The above data is for illustration purposes.

The step of merging by the computer processor the modeled power and energy time series data with the measured power and energy time series data to determine a to provide a performance ratio time series combines the measured and modeled time series so that we have a sequence of pairs (measured power, modeled power) and corresponding timestamps. This matches up the timestamps between the measured and modeled timeseries as is depicted in FIG. 8. The performance ratio is then just the modeled energy divided by the measured value for a given timestamp. That is, we are dividing one series by the other point wise.

FIG. 9 depicts the step of determining in a computer processor a normalized daily effective system capacity time series by calculating the daily maximum of the performance ratio times series with outliers removed to provide a normalized daily effective system capacity time series. In the example shown, we remove points based on the snow depth on the ground at that location and for that timestamp. By way of an example cut-off, use a foot as a threshold.

FIG. 10 depicts determining in a computer processor a set of differentials between consecutive daily data points in the normalized daily effective system capacity time series. The differential is just the value of the effective system size at day t+1 minus the value at day t. As can be seen, on Jan. 2, 2015 we saw a drop. We would typically see a drop like this if one fifth of the system capacity suffered partial failure on Jan. 2, 2015.

Figure 12:
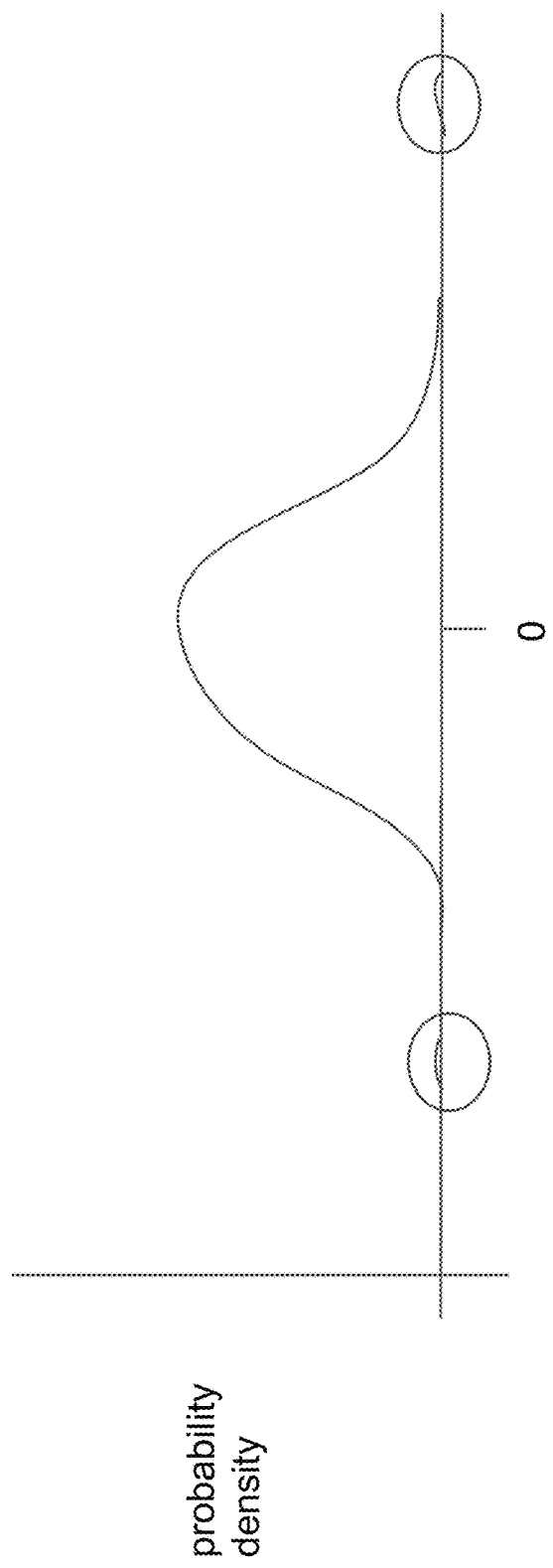
FIG. 12 depicts an anomaly filter according to the present invention.

There are many ways to do an anomaly filter according to the present invention. One simple way, by way of example, is to calculate the sample mean u_s and sample standard deviation o_s of the set of all differentials calculated in the previous step and then label any of the differentials that are greater than u_s+3 o_s or less than u_s−3 o_s as outliers. The basic idea is that these anomalies occur on timestamps where the effective system size changed (i.e., part of the array of pv panels failed or came back online after being repaired). FIG. 12 depicts a simple figure illustrating what this distribution will typically look like.

Figure 13:
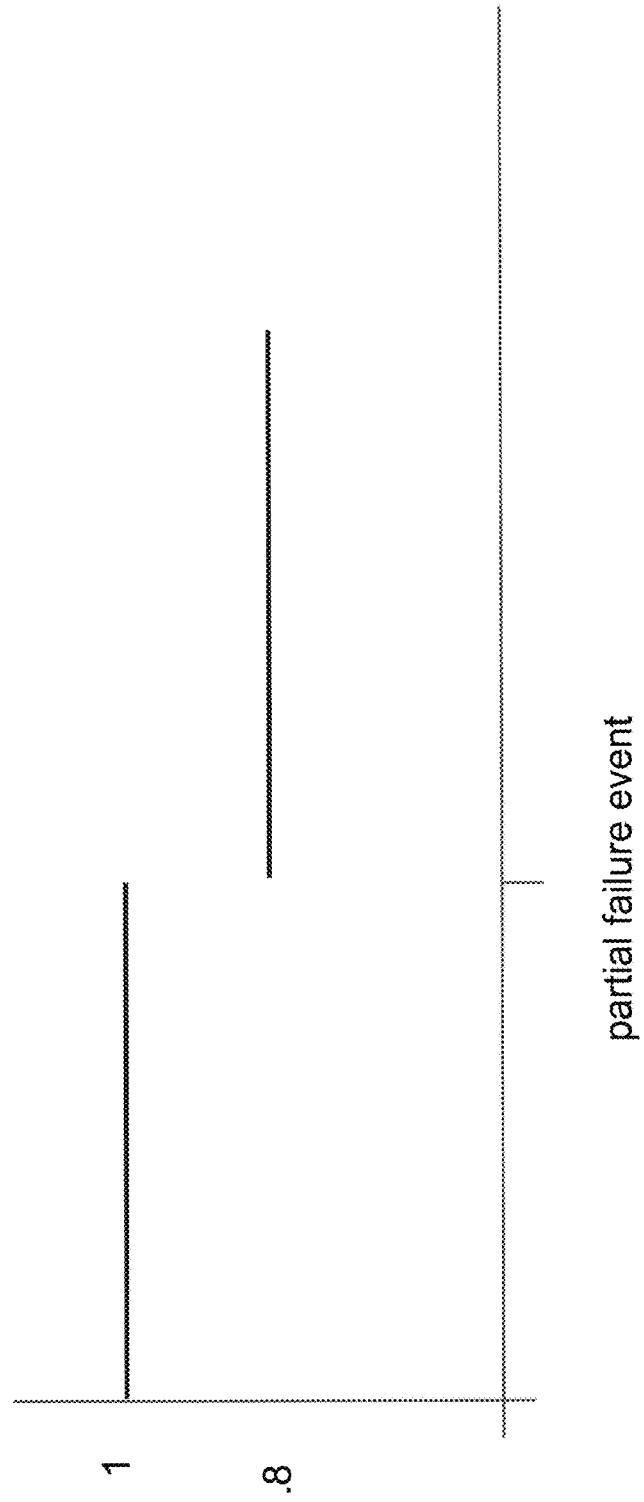
FIG. 13 depicts partitioning based on the dates of the anomalies identified as days on which the capacity of the system is likely to have changed according to the present invention.

Partitioning means taking the whole performance ratio time series and splitting it into chunks based on the dates of the anomalies identified as days on which the capacity of the system is likely to have changed. In the example above, this would mean that we would then have 2 time series, one for the data before the day on which the capacity of the system is likely to have changed (Jan. 2, 2015) and one for the data after Jan. 2, 2015. Taking the averages of the daily effective system sizes in both time series should in this case give us a daily effective system size of 1 before Jan. 2, 2015 and an effective size of 0.8 afterwards. This is depicted in FIG. 13.

FIG. 11 depicts the inferred daily effective system size. If we multiply the modeled energy values by this value, we will get estimates of the energy lost to partial system downtime.

The method of the present invention may be summarized as follows. The modeled power and energy time series data should be calculated from the irradiance data, weather data, and system configuration information using industry standard power and energy generation PV modeling techniques. The measured and modeled energy time series is merged so that the pointwise ratio of these two time series can be calculated. Call this time series of ratios the performance ratio time series. Remove outliers (including days with excessive levels of snow cover) from this time series and then calculate the daily maximum of this time series. Call this the normalized daily effective system capacity time series. Calculate the differentials between consecutive daily data points in the normalized daily effective system capacity time series. Apply an anomaly filter to the differentials calculated in the previous step to identify days on which the capacity of the system is likely to have changed. Partial system failure events that instantaneously reduce the amount of energy generated by the PV system reduce the effective size of the system will be detected by this filter as large negative changes in effective system size. Partitioning the normalized daily effective system capacity time series at the timestamps where anomalous changes in the effective size of the PV system were detected and then calculating measures of central tendency for the resulting partitions generates a piecewise constant time series that describes the normalized daily effective system size. Modulating the modeled power and energy time series by the inverse of the time series found in the previous step generates an estimate of the power and energy losses due to partial equipment failure.

The present invention has many advantages and useful applications. The present invention is utilized to Quantify the energy losses due to partial equipment failure for a PV system. Applying the methodology described here to data collected for a PV system will generate estimates of the energy losses due to partial equipment failure. Potential uses of this information include: Remotely identifying PV systems that are currently experiencing equipment failure and are potentially in need of repair; Optimizing the dispatch of field service crews based on geographic clusters of sites that could be repaired and knowledge of how much energy each repair could yield; Validating design (i.e., pre-build) estimates of the expected equipment failure losses for a PV system; Verifying manufacturer estimates of the failure rates of components used in the construction of PV systems; Developing statistical models of the failure rates of specific PV system components (e.g., DC-AC inverters); Improving methodologies for calculating design estimates of expected equipment failure losses for a PV system; Verifying guarantees about the level of equipment failure losses for a PV system; Determining a cause for PV systems underperforming contractual performance guarantees.

The present invention is also useful in quantifying the monetary losses due to partial equipment failure for a PV system. Once an estimate of the energy losses due to partial equipment failure for a PV system are in place it is possible to estimate the monetary losses incurred due to this lost energy production using an electricity price rate schedule for the location in question. There are a number of potential uses for this information including: Equipment replacement planning: Once a dollar value has been placed on the value of partial equipment energy losses for a period, the payoff of replacing the partly broken system can be estimated which can inform decisions about whether and when to replace the component or system. Attributing a cause to monetary losses due to PV systems underperforming guaranteed performance levels.

The present invention is also useful for forecasting the energy (monetary) losses due to future partial equipment failure. Applying the methodology described here to the energy generation history of a large and geographically distributed fleet of systems allows for the generation of metrics about how often partial downtime will occur in either individual PV systems or in fleets of systems. Creating forecasts is trivial once this information is in hand. Potential uses for these include: Assessing the risk in or assessing the value of performance guarantees on the energy production of a PV system. Assessing the value of solar PV assets: estimates of the future partial equipment failure losses of a site can be used an input to more precisely assess the value of a solar PV asset. This can be applied to individual PV system, fleets of solar assets or interests therein, or to PV assets sold as part of a larger residential or commercial real estate transaction. Assessing the value of financial products collateralized against residential or commercial real estate that includes a PV system: Installing a PV system on a residential or commercial building will change the value of that property, and estimates of future partial equipment failure losses can be used to more accurately assess that change. Any financial product collateralized against such a property can then be more accurately valued if the value of the PV system that is a part of the collateral can be more precisely valued. Solar permitting, grid operations and planning: Knowledge of typical partial equipment failure energy loss levels across a representative sample of PV systems could allow grid operators to more precisely predict the effect that deployment of solar assets on the overall operation of the electric grid. This information could be used in the context of predicting the effects for the grid of issuing more permits for solar generation resources. Assessing the value of non-solar electrical generation resources. Continuing the previous point, if this information is useful in assessing the impact of solar generation on the grid, this information can also be used to inform energy price estimates and expected utilization levels for non-solar energy generation resources (e.g., coal or natural gas power plants).

The present invention envisions a system for the estimation of PV system energy losses due to partial equipment failure based on: measured power & energy data for the system; configuration data describing the size, orientation and location of the system; solar irradiance data at the location of the PV system; weather data including temperature, wind conditions and precipitation at the location of the PV system; module level measured temperature data; snow depth and precipitation data for the location of the PV system; modeled power and energy data for the system.

It should be understood that the foregoing relates to preferred embodiments of the invention and that modifications may be made without departing from the spirit and scope of the invention as set forth in the following claims.

We claim:

1. A method of monitoring a photovoltaic system and quantifying energy losses due to partial equipment failure, comprising:
   inputting modeled power and energy time series data for the photovoltaic system into a computer processor, wherein the modeled power and energy time series data includes a set of a timestamp, a modeled power and a modeled energy;
   receiving measured power and energy time series data for the photovoltaic system, wherein the measured power and energy time series data includes a set of actual data readings having a power and energy reading with an associated measured time series data timestamp;
   inputting the measured power and energy time series data into a computer processor;
   merging by the computer processor the modeled power and energy time series data with the measured power and energy time series data to determine and to provide a performance ratio time series;
   determining in a computer processor a normalized daily effective system capacity time series by calculating a daily maximum of the performance ratio times series with outliers removed to provide the normalized daily effective system capacity time series;
   determining in a computer processor a set of differentials between consecutive daily data points in the normalized daily effective system capacity time series;
   applying an anomaly filter to the set of differentials between consecutive daily data points in the normalized daily effective system capacity time series to identify days on which a capacity of the photovoltaic system is likely to have changed;
   partitioning the normalized daily effective system capacity time series and then calculating measures of central tendency for the resulting partitions to generate a piecewise constant time series that describes a normalized daily effective system size; and
   modulating the modeled power and energy time series data by an inverse of the piecewise constant time series to provide an estimate of power and energy losses due to partial equipment failure.

2. A method as in claim 1, wherein the outliers are days with excessive levels of snow cover.

3. A method as in claim 1, wherein the modeled power and energy time series data is calculated from irradiance data, weather data and photovoltaic system configuration information.

4. A method as in claim 1, wherein the measured power and energy time series data is measured with an on-site physical sensor installed in the photovoltaic system or in an inverter.

5. A method as in claim 1, wherein the modeled power and energy time series data provides an estimate of what the power and energy production of the photovoltaic system would be in the absence of equipment failure.

6. A method as in claim 1, wherein the measured power and energy time series data includes measured irradiance data.

7. A method as in claim 1, further comprising:
remotely identifying PV systems that are currently experiencing equipment failure and are in need of repair.

8. A method as in claim 1, wherein the modeled power and energy time series data is according to configuration data, wherein the configuration data includes at least one of a size of the photovoltaic system, an orientation of the photovoltaic system and a location of the photovoltaic system.

9. A method as in claim 1, wherein the measured power and energy time series data is according to at least one of solar irradiance data at the location of the photovoltaic system, weather data including temperature, wind conditions and precipitation at the location of the photovoltaic system, module level measured temperature data, snow depth data, and precipitation data for the location of the photovoltaic system.

10. A method as in claim 1, wherein determining in a computer processor a normalized daily effective system capacity time series further comprises:
removing outliers in the performance ratio time series to provide a performance ratio times series with outliers removed; and
calculating the daily maximum of the performance ratio times series with outliers removed to provide the normalized daily effective system capacity time series.

11. A method as in claim 1, wherein the modeled power and energy time series data is according to photovoltaic system configuration data.

12. A method as in claim 11, wherein the photovoltaic system configuration data is a size, an orientation, an age, and a location of the photovoltaic system.

13. A method as in claim 12, wherein the orientation is a tilt angle and an azimuth angle for panels of the photovoltaic system.

14. A method as in claim 1, further comprising assessing the impact of the energy losses due to partial equipment failure on a contract associated with the photovoltaic system.

15. A method as in claim 1, further comprising validating design estimates of expected equipment failure losses for the photovoltaic system.

16. A method as in claim 1, further comprising developing a statistical model of the failure rates of components of the photovoltaic system.

17. A method as in claim 1, further comprising determining a cause for underperforming a contractual performance guarantee associated with the photovoltaic system.

18. A method as in claim 1, further comprising assessing risk associated with a performance guarantee on energy production of the photovoltaic system.

* * * * *